United States Patent
Nishio et al.

(10) Patent No.: US 8,006,219 B2
(45) Date of Patent: Aug. 23, 2011

(54) WIRING PATH INFORMATION CREATING METHOD AND WIRING PATH INFORMATION CREATING APPARATUS

(75) Inventors: Yoshitaka Nishio, Kawasaki (JP); Eiichi Konno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 468 days.

(21) Appl. No.: 12/222,661

(22) Filed: Aug. 13, 2008

(65) Prior Publication Data

US 2009/0125862 A1    May 14, 2009

(30) Foreign Application Priority Data

Nov. 12, 2007   (JP) .................. 2007-293441

(51) Int. Cl.
*G06F 17/50* (2006.01)

(52) U.S. Cl. ........... 716/132; 716/55; 716/113; 716/126

(58) Field of Classification Search ........... 716/55, 716/113, 126, 132
See application file for complete search history.

(56) References Cited

U.S. PATENT DOCUMENTS 6,240,541 B1 * 5/2001 Yasuda et al. ................ 716/112
7,143,385 B2   11/2006 Itou et al.

FOREIGN PATENT DOCUMENTS

| JP | 04-264983 | 9/1992 |
| JP | 07-296027 | 11/1995 |
| JP | 08-006972 | 1/1996 |
| JP | 08-137927 | 5/1996 |
| JP | 08-263539 | 10/1996 |
| JP | 2004-287681 | 10/2004 |

* cited by examiner

*Primary Examiner* — Thuan Do
(74) *Attorney, Agent, or Firm* — Staas & Halsey LLP

(57) ABSTRACT

A wiring processing apparatus decides each group formed by sorting signals that flow between component pins. Then, the wiring processing apparatus reads printed circuit board data and identifies a net cluster that belongs to each group. After a net cluster that belongs to each group is identified, the wiring processing apparatus refers to the printed circuit board data about the identified net cluster, and automatically creates each wiring route that indicates a wiring scanning area of the signal cluster in each group. Thus the wiring processing apparatus displays them on the printed board data. After the wiring route is automatically created, the wiring processing apparatus automatically creates wiring route information that corresponds to each wiring route, and controls them according to each wiring route.

22 Claims, 15 Drawing Sheets

FIG.4
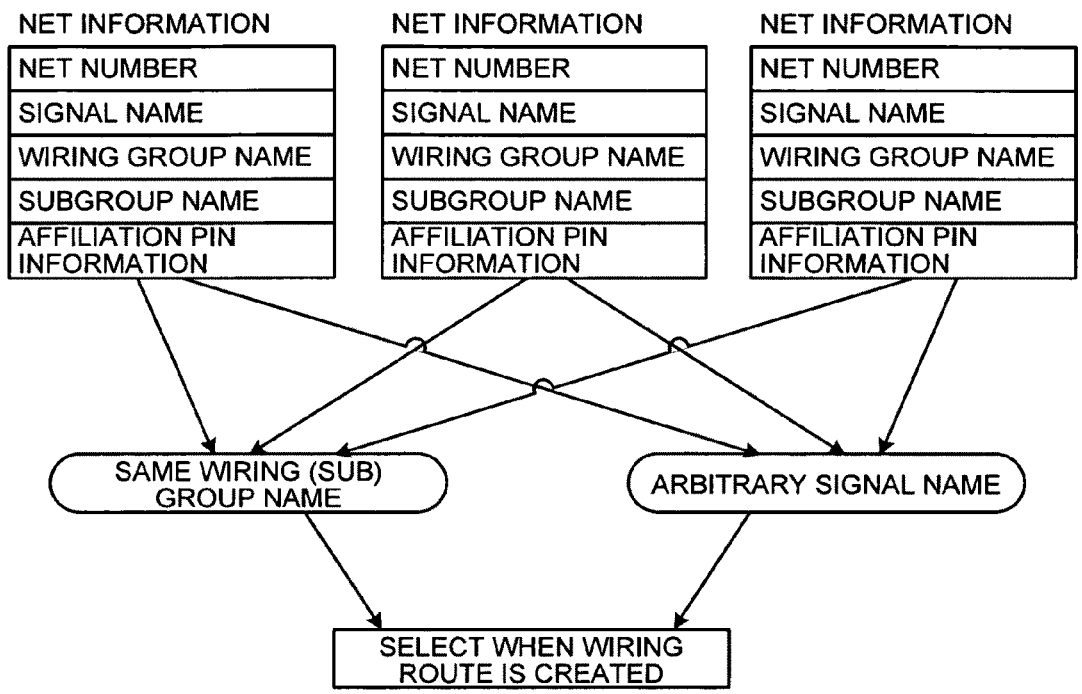
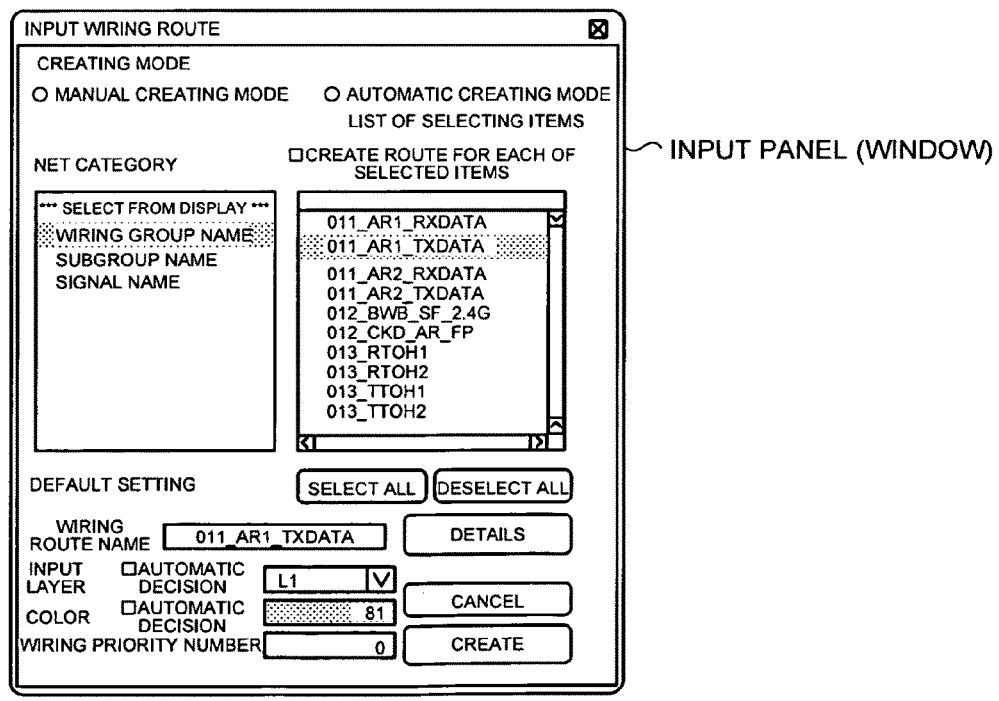

WIRING PATH INFORMATION CREATING METHOD AND WIRING PATH INFORMATION CREATING APPARATUS

BACKGROUND OF THE INVENTION

1. Field of the Invention

The present invention relates to a wiring path information creating method, a wiring path information creating program, and a wiring path information creating apparatus.

2. Description of the Related Art

In recent years, performing automatic wiring for printed circuit boards is becoming more difficult, because signal speed of large scale integrations (LSIs) is becoming faster as well as LSIs are manufactured in such a way that they have many pins and ball grid arrays (BGAs) are used for them, thus their size is becoming larger. Thus, various technologies that perform automatic wiring have been proposed. For example, in Japanese Patent Application Laid-open No. 4-264983, a technology is proposed of which an object is to assist automatic wiring such that even an unskilled designer can design a wiring pattern as high-quality as one designed by a skilled designer, by using knowledge processing in automatic wiring in printed boards.

In Japanese Patent Application Laid-open No. 4-264983, an unskilled designer, based on knowledge and know-how of skilled designers stored in knowledge base, refers to information pertaining to printed board wiring, and draws an inference therefrom. Thus the unskilled designer creates information pertaining to wiring strategy for printed board wiring, and provides the information to an automatic processing unit. The automatic processing unit searches for a wiring algorithm according to the wiring strategy and executes the algorithm.

In the conventional technology, however, a problem remains in that a design period is considerably prolonged. That is because in the conventional technology some of printed board wiring procedures, for example, accumulating knowledge base pertaining to printed board wiring and constructing wiring strategy based on the knowledge base, still must be performed manually.

The larger the LSIs are in size and the faster a signal speed thereof is, the heavier a labor load of the designer is.

SUMMARY

It is an object of the present invention to at least partially solve the problems in the conventional technology.

According to an aspect of the present invention, a wiring path information creating method is for creating wiring path information pertaining to wiring processing of a printed board with a computer. The method includes deciding each group formed by sorting signals that flow on the printed board; automatically creating one or more wiring paths each indicating a wiring scanning area of a signal cluster in each group; displaying the wiring paths on printed board data; automatically creating wiring path information that corresponds to each of the wiring paths thus displayed; and controlling the wiring path information created for each of the wiring paths.

According to another aspect of the present invention, a computer program product causes a computer to perform the method according to the present invention.

According to still another aspect of the present invention, a wiring path information creating apparatus for creating wiring path information pertaining to wiring processing of a printed board with a computer includes a wiring path information creating unit that decides each group formed by sorting signals that flow on the printed board, automatically creates one or more wiring paths each indicating a wiring scanning area of a signal cluster in each group, displays the wiring paths on printed board data, and automatically creates wiring path information that corresponds to each of the wiring paths thus displayed; and a wiring path information control unit that controls the wiring path information created for each of the wiring paths.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a diagram of an example of selecting signals that belong to a wiring route according to the first embodiment;

DETAILED DESCRIPTION OF THE PREFERRED EMBODIMENTS

Referring to the attached drawings, exemplary embodiments of a wiring path information creating method, a wiring path information creating program, and a wiring path information creating apparatus of the present invention will be described in detail. As a first embodiment of the present invention, a wiring processing apparatus that executes a wiring path information creating method as an embodiment of a wiring path information creating method of the present invention will be described. Then, other embodiments of the present invention will be described by way of other embodiments.

In the first embodiment, an overview and features of a wiring processing apparatus according to the first embodiment will be described. Next, configuration and processing thereof will be described. Then, advantages of the first embodiment will be described in the end.

Figure 1:
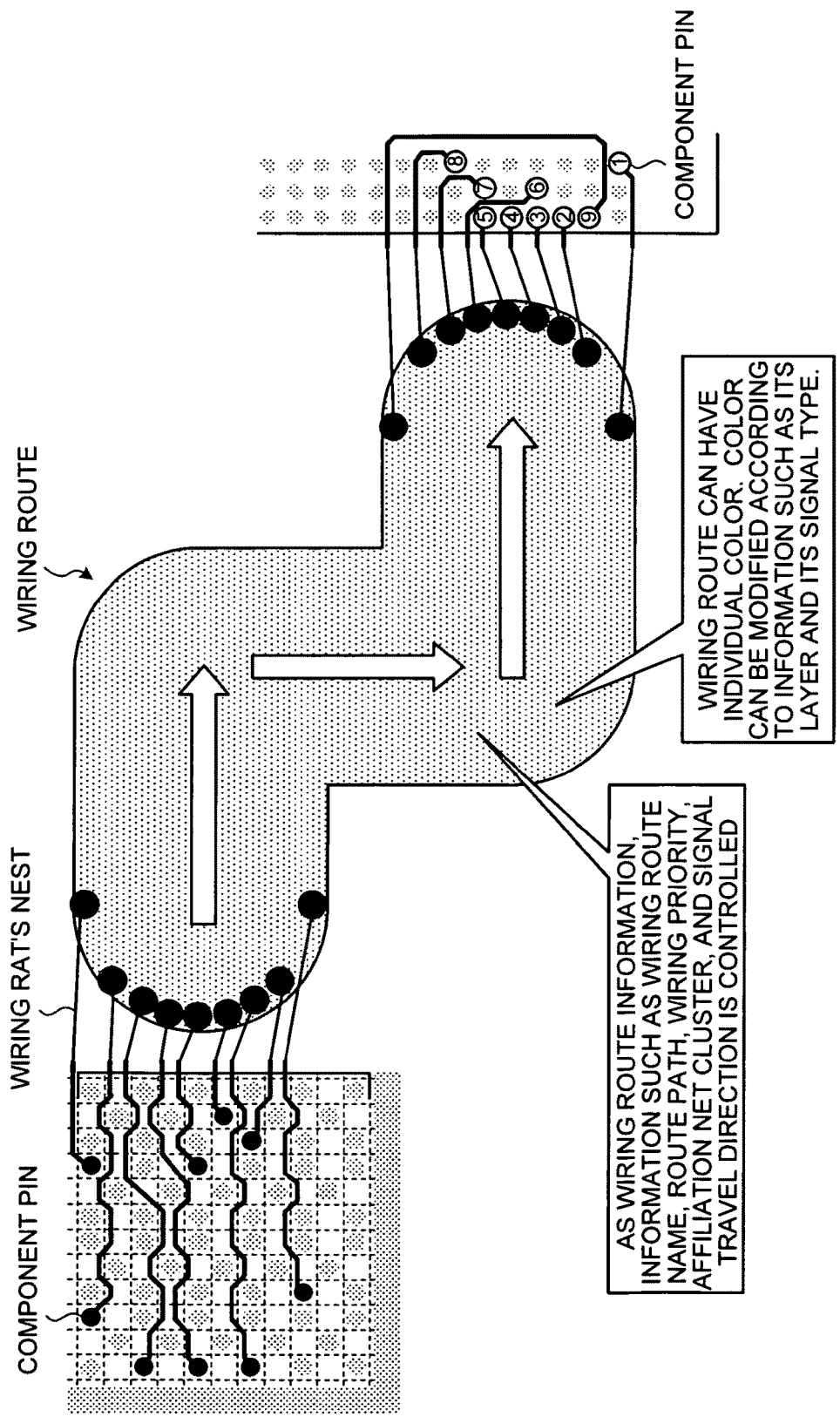
FIG. 1 is a diagram for explaining an overview and features of the wiring processing apparatus according to a first embodiment of the present invention.

Referring to FIG. 1, an overview and features of a wiring processing apparatus according to the first embodiment will be described. FIG. 1 is a diagram for explaining an overview and features of the wiring processing apparatus according to the first embodiment.

The wiring processing apparatus according to the first embodiment generally creates wiring path information pertaining to the wiring processing of a printed board. More specifically, the wiring processing apparatus decides each group that is formed by sorting signals that flow on the printed board, and automatically creates a wiring route that indicates a wiring scanning area of a signal cluster within each group, and displays the same on a printed board data as well as automatically creates each wiring path information that corresponds to each wiring route and controls the same.

Explaining this main feature, the wiring processing apparatus according to the first embodiment includes printed circuit board data used for wiring processing, by storing the same in advance therein. An apparatus administrator of the wiring processing apparatus according to the first embodiment configures settings, for example, of each group formed by sorting each signal that flows between component pins on the printed circuit board through an input panel, a window, or the like that is displayed, for example, on a monitor of the wiring processing apparatus. When the settings are completed, the apparatus administrator inputs a creating instruction to request to create a wiring route from the input panel or other units.

When the wiring processing apparatus according to the first embodiment receives the creating instruction from the apparatus administrator, the wiring processing apparatus decides, based on the settings performed by the apparatus administrator, each group formed by sorting signals that flow between component pins. Then, the wiring processing apparatus according to the first embodiment reads the printed circuit board data and identifies a net cluster that belongs to each group.

After a net cluster that belongs to each group is identified, the wiring processing apparatus according to the first embodiment refers to the printed circuit board data about the identified net cluster. Then, the wiring processing apparatus automatically creates each wiring route that indicates a wiring scanning area of a signal cluster within each group, and displays the same on the printed board data.

After the wiring route is automatically created, the wiring processing apparatus according to the first embodiment creates automatically wiring route information that corresponds to each wiring route, and controls the same for each wiring route. It should be noted that the wiring route information is created based on information contained in the creating instruction received from the apparatus administrator and the information about the automatically created wiring route, and includes information such as a wiring route name, a route path, wiring priority, an affiliation net cluster, and signal travel direction.

Thus, as shown in the main feature, the wiring processing apparatus according to the first embodiment decides each group formed by sorting signals that flow on the printed board, automatically creates a wiring route that indicates a wiring scanning area of a signal cluster within each group, and displays the same on the printed board data as well as automatically creates each wiring path information that corresponds to each wiring route and controls the same.

Thus, wiring of a critical printed board can be simplified as well as a design period of a printed board can be reduced.

Figure 2:
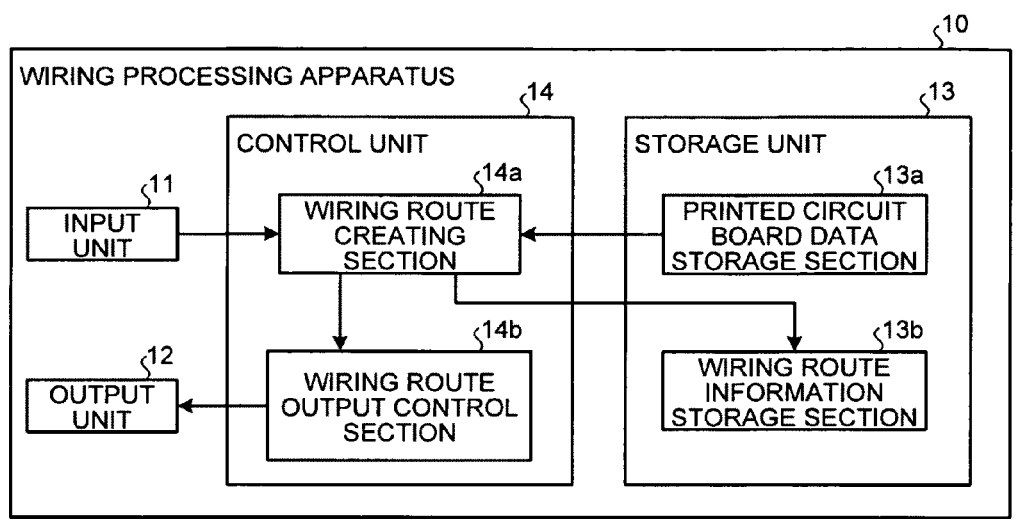
FIG. 2 is a block diagram of configuration of the wiring processing apparatus shown in FIG. 1.
Figure 3:
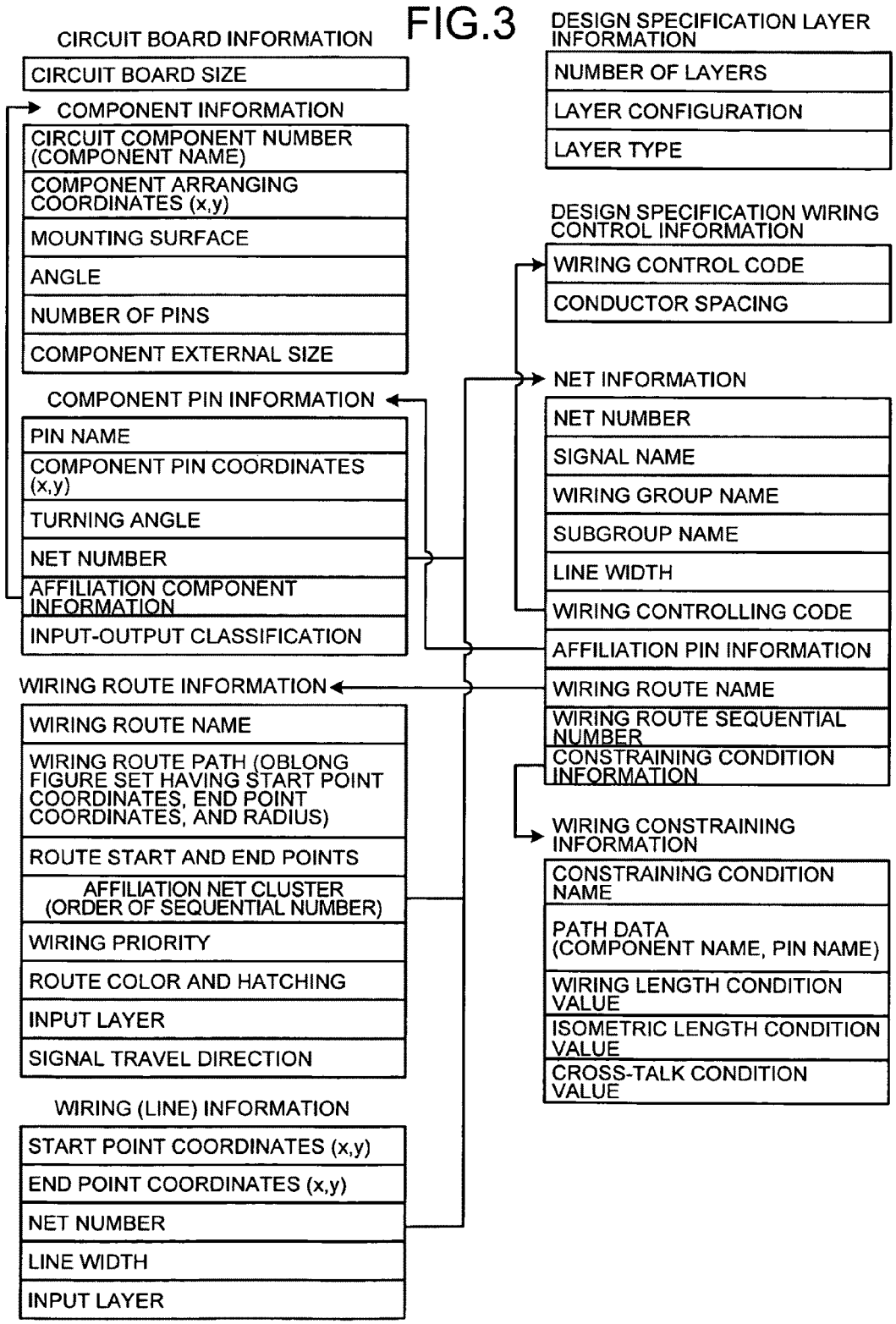
FIG. 3 is a correlation diagram of printed circuit board data and wiring route information according to the first embodiment.
Figure 5:
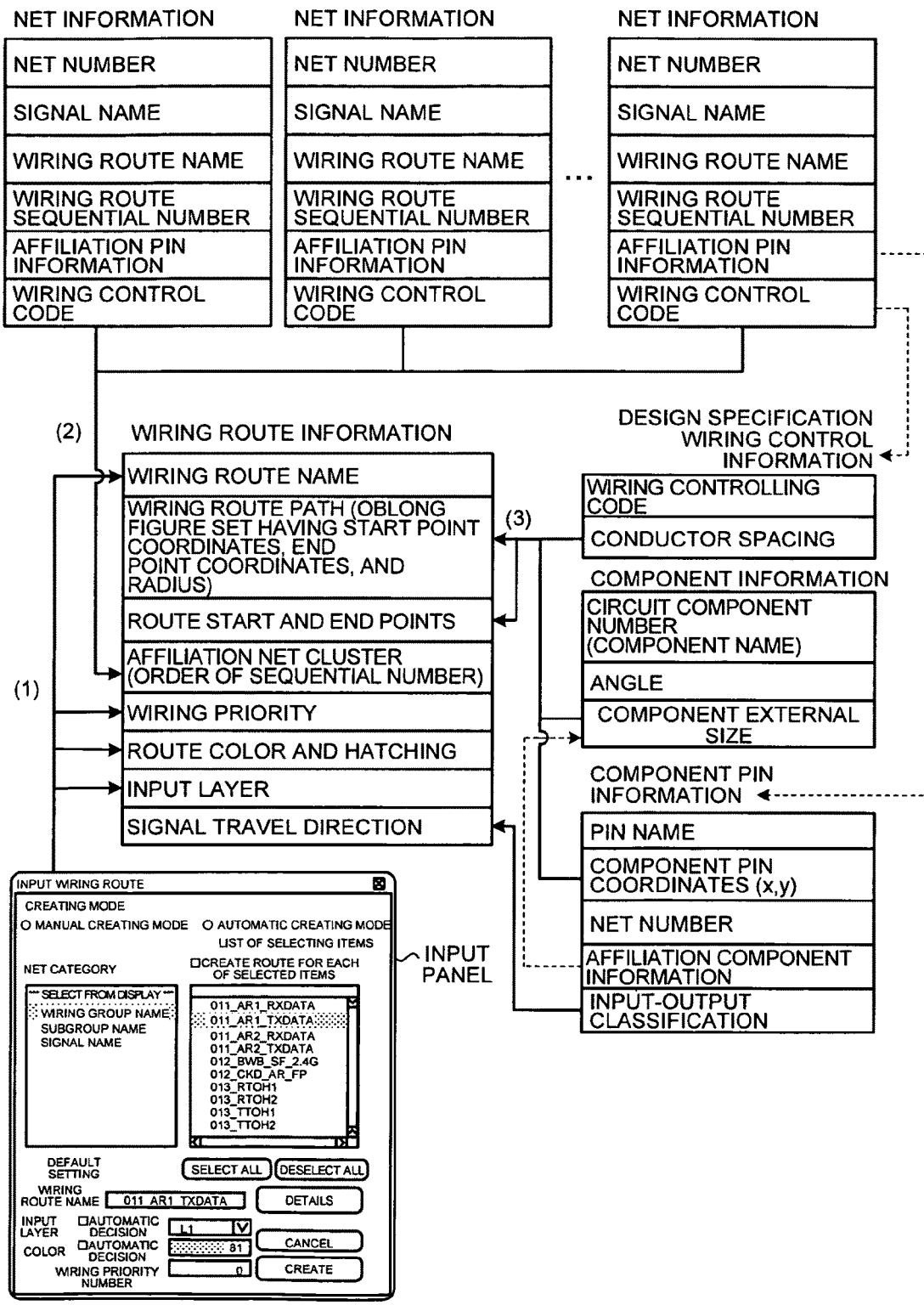
FIG. 5 is a diagram of an example of creating wiring route information according to the first embodiment.
Figure 6:
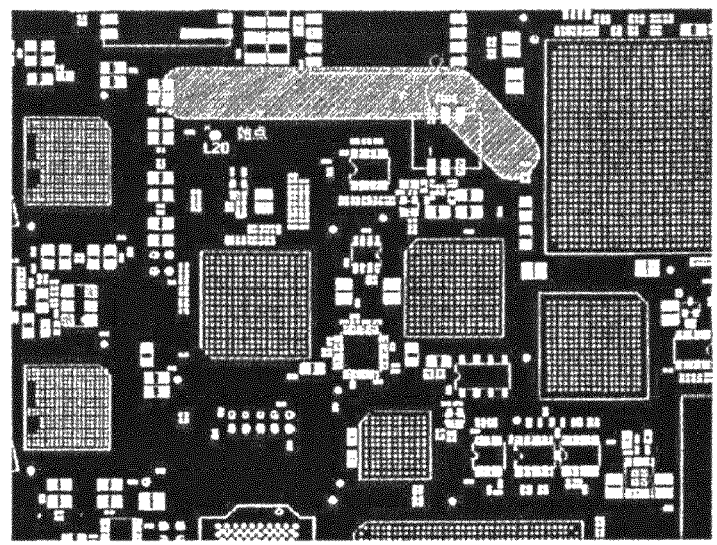
FIG. 6 is a diagram of an example of displaying wiring routes according to the first embodiment.
Figure 7:
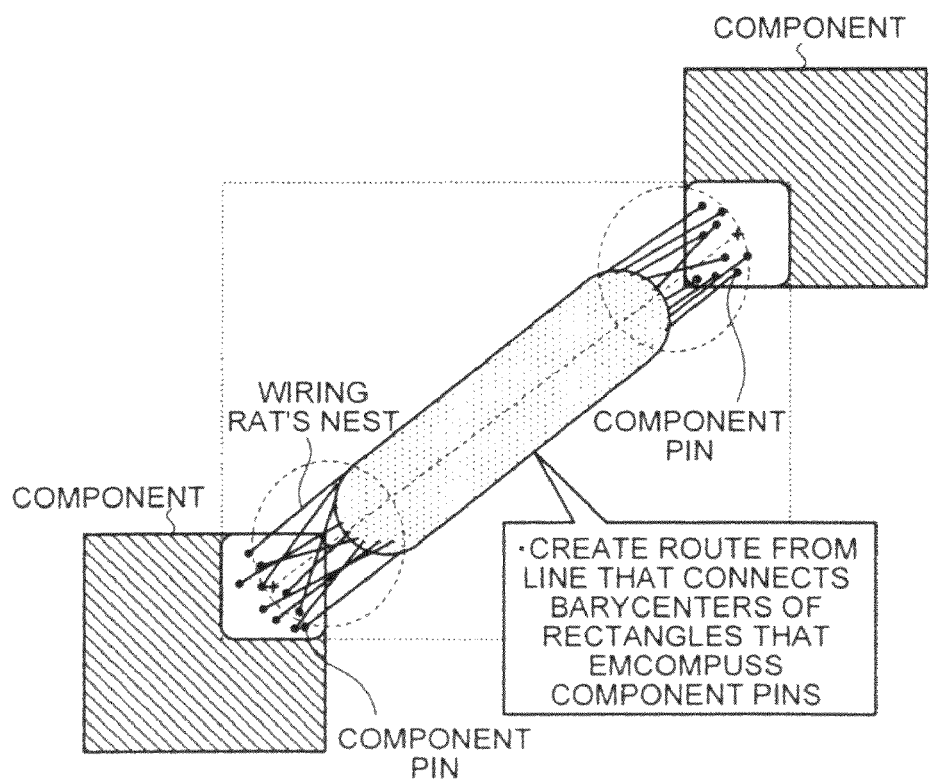
FIG. 7 is a diagram of an example of creating a wiring route according to the first embodiment.
Figure 8:
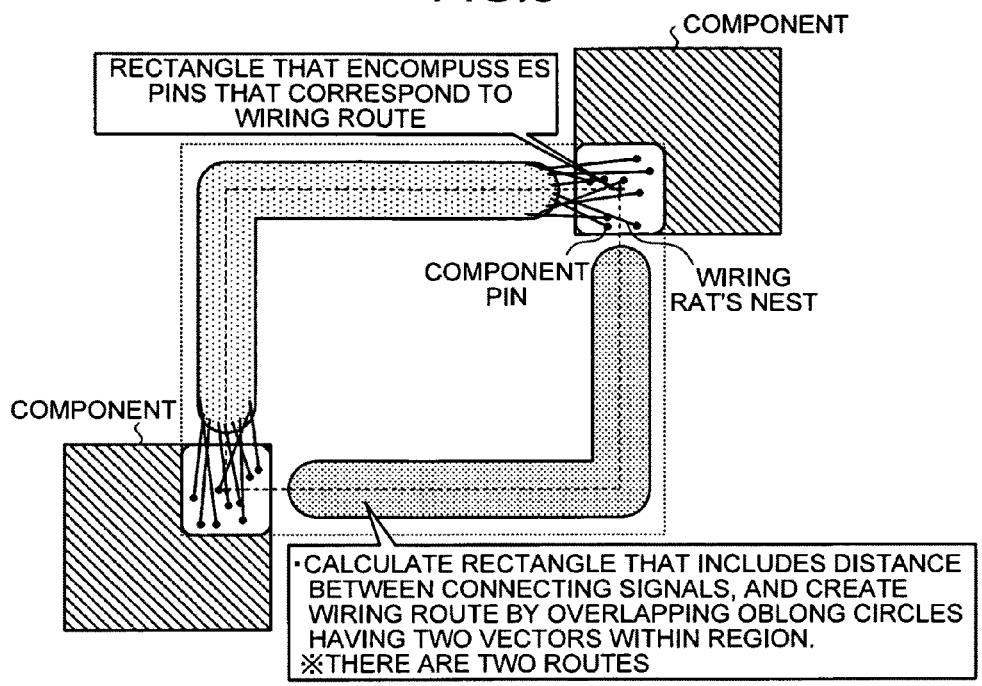
FIG. 8 is a diagram of an example of creating wiring routes according to the first embodiment.
Figure 9:
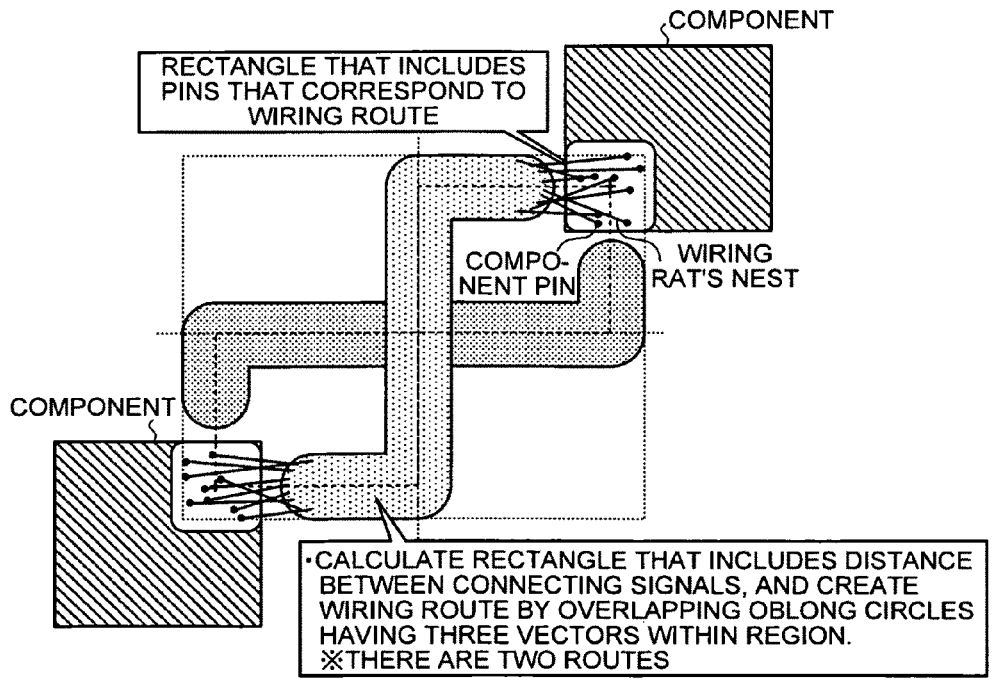
FIG. 9 is a diagram of an example of creating wiring routes according to the first embodiment.
Figure 10:
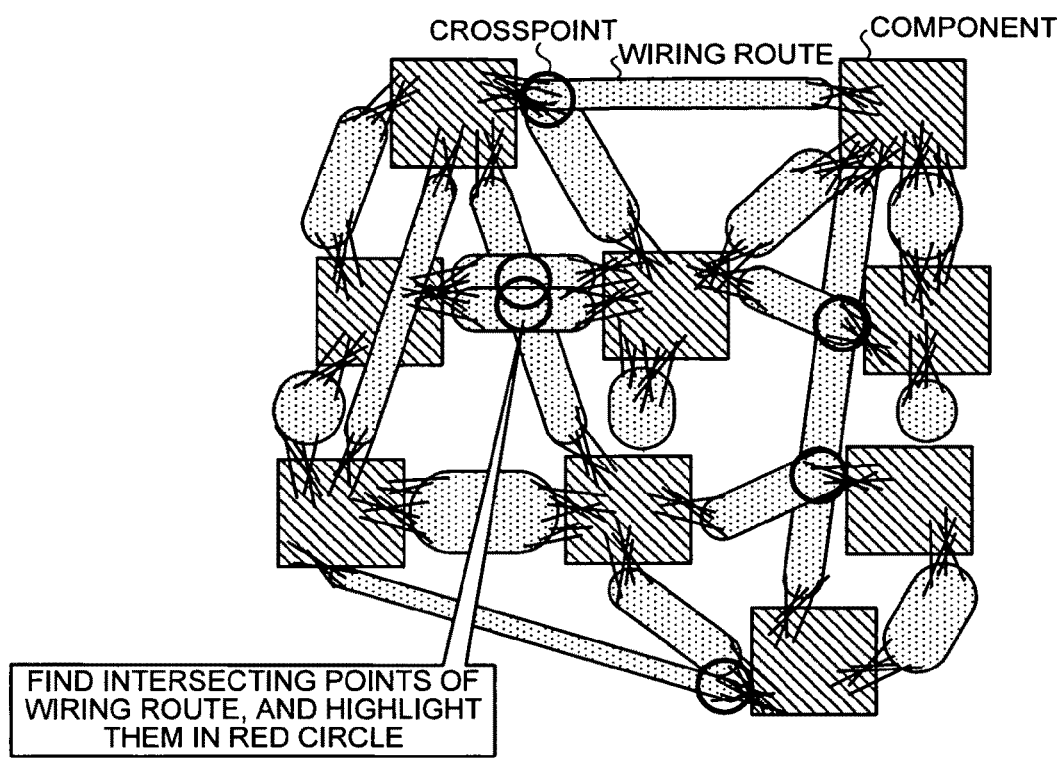
FIG. 10 is a diagram of an example of displaying wiring routes according to the first embodiment.
Figure 11:
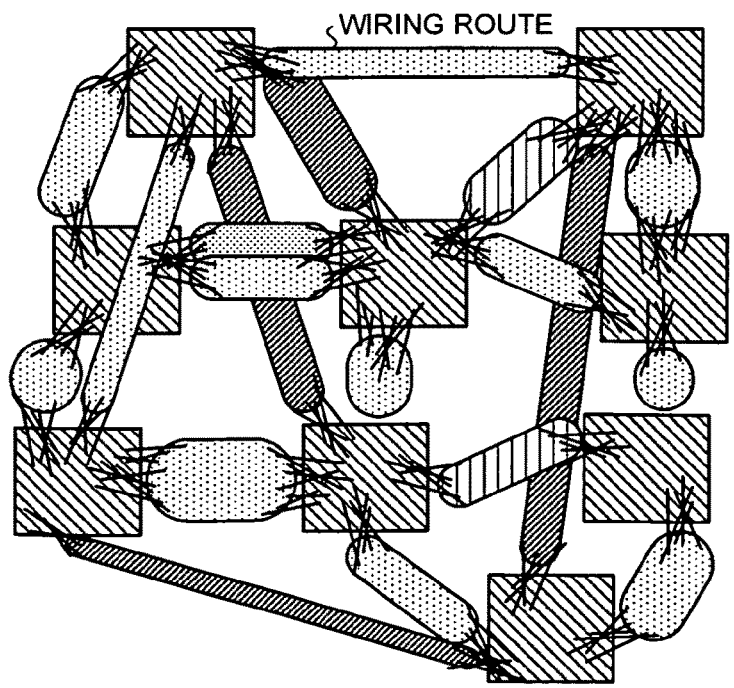
FIG. 11 is a diagram of an example of displaying wiring routes according to the first embodiment.

Referring to FIGS. 2 to 11, a configuration of the wiring processing apparatus according to the first embodiment will be described. FIG. 2 is a block diagram of the configuration of the wiring processing apparatus according to the first embodiment. FIG. 3 is a correlation diagram of printed circuit board data and wiring route information according to the first embodiment. FIG. 4 is a diagram of an example of selecting signals that belong to a wiring route according to the first embodiment. FIG. 5 is a diagram of an example of creating wiring route information according to the first embodiment. FIG. 6 is a diagram of an example of displaying wiring routes according to the first embodiment. FIGS. 7 to 9 are diagrams of examples of creating wiring routes according to the first embodiment. FIGS. 10 and 11 are diagrams of examples of displaying wiring routes according to the first embodiment.

As shown in FIG. 2, a wiring processing apparatus 10 according to the first embodiment includes an input unit 11, an output unit 12, a storage unit 13, and a control unit 14.

The input unit 11 receives various information from an apparatus administrator of the wiring processing apparatus 10 according to the first embodiment, and includes a keyboard, a mouse, and a microphone. The input unit 11 receives inputs such as settings of each group formed by sorting signals that flow between component pins on the printed board, wiring route names, wiring priority, route color and hatching, and input layer.

When the apparatus administrator configures settings of each group formed by sorting signals that flow between component pins on the printed board, for example, as shown in FIG. 4, settings of wiring group name and subgroup name contained in net information are configured by selecting on an input panel as well as signal name is selected individually.

When the output unit 12, which will be described below, includes a monitor, the output unit 12 cooperates with a mouse so that the output unit 12 and the mouse implement pointing device function.

The output unit 12 outputs various information, and includes a monitor (or a display or a touch panel) and a speaker. The output unit 12 outputs and displays, for example, a wiring route on the printed circuit board data.

The storage unit 13 stores therein data and a program that are necessary for various processing performed by the control unit 14. The storage unit 13 includes a printed circuit board data storage section 13a and a wiring route information storage section 13b, which are closely related to the present invention.

The printed circuit board data storage section 13a is a storage section that stores therein printed circuit board data used in wiring processing. More specifically, the printed circuit board data storage section 13a is configured by storing therein circuit board information, component information, component pin information, design specification layer information, design specification wiring control information, net information, wiring constraining information, wiring (line) information, and the like, as shown in FIG. 3.

The circuit board information includes circuit board size. The component information includes circuit component number (component name), component arranging coordinates, mounting surface, angle, pin number, and component external size. The component pin information includes, pin names, component pin coordinates, turning angles, net numbers, affiliation component information, and input-output classifications. The design specification layer information includes the number of layers, layer configuration, and layer type. The design specification wiring control information includes wiring control code and conductor spacing. The net information includes net number, signal name, wiring group name, subgroup name, wiring width, wiring control code, affiliation pin information, wiring route name, wiring route serial number, and constraining condition information. The wiring constraining information includes constraining condition name, path data (component name and pin name), wiring length condition value, isometric length condition value, and cross-talk condition value. The wiring (line) information includes start point coordinates, end point coordinates, net number, wiring width, and input layer.

The wiring route information storage section 13b is a storage section that stores therein various information pertaining to a wiring route. More specifically, as illustrated in FIG. 3, the wiring route information storage section 13b is configured by storing therein, as wiring route information, wiring route name, wiring route path, route starting and end points, affiliation net cluster, wiring priority, route color and hatching, input layer, signal travel direction, and the like.

The wiring route information storage section 13b may further store therein alignment sequence (order of sequential numbers) of each signal contained in a wiring route as well as information such (not shown in FIG. 3) as a critical level of a signal that manipulates wiring and conductor spacing of signals that are the object of wiring.

Some of the information stored in the printed circuit board data storage section 13a are associated with each other, as well as some of the data stored in the printed circuit board data storage section 13a are associated with some of the data stored in the wiring route information storage section 13b. For example, wiring constraining information stored in the printed circuit board data storage section 13a can be obtained by using constraining condition information of net information stored in the printed circuit board data storage section 13a, and the affiliation net cluster stored in the wiring route information storage section 13b can be obtained from net information stored in the printed circuit board data storage section 13a.

The control unit 14, including an internal memory that stores therein a certain control program or a program that provides various processing procedures and required data, is a processing unit that executes various processing by using them. The control unit 14 includes a wiring route creating section 14a and a wiring route output control section 14b, which are closely related to the present invention.

The wiring route creating section 14a is a processing section that performs processing such as creating a wiring route (an oblong figure set having start point coordinates, end point coordinates, and a radius). More specifically, the wiring route creating section 14a receives a creating instruction from the apparatus administrator via the input unit 11 (see (1) in FIG. 5), and then decides each group formed by sorting signals that flow between component pins, based on the settings performed by apparatus administrator that is contained in the creating instruction (settings of wiring group and subgroup that belong to a wiring route, and signal name).

The wiring route creating section 14a reads printed circuit board data from the printed circuit board data storage section 13a, and then identifies a net cluster that belongs to each group based on net information of the printed circuit board data (see (2) in FIG. 5). After a net cluster that belongs to each group is identified, the wiring route creating section 14a refers one by one to design specification wiring control information, component information, and component pin information that are contained in the printed circuit board data, based on affiliation pin information and a wiring control code that are contained in the net information corresponding to each of the identified net clusters. Then, the wiring route creating section 14a automatically creates a wiring route that indicates a wiring scanning area of a signal cluster within each group (see (3) in FIG. 5) and transmits an output display instruction to the wiring route output control section 14b that will be described below.

The wiring route creating section 14a creates a wiring route having a vector, two vectors, or three vectors, as shown, for example, in FIGS. 7 to 9. For example, when a wiring route having a vector is created, the wiring route creating section 14a refers one by one to design specification wiring control information, component information, and component pin information that are contained in the printed board data, based on affiliation pin information and a wiring control code that are contained in net information corresponding to each of the identified net clusters. Thus, the wiring route creating section 14a obtains a rectangle that includes the component pins of each component, and a wiring route is created from the barycenter of the rectangle. The wiring route creating section 14a further creates a wiring rat's nest that shows a destination of signals from a component pin to a wiring route, along with creating the wiring route.

The wiring route creating section 14a also automatically creates wiring route information corresponding to each wiring route. More specifically, the wiring route creating section 14a creates wiring route information by processing the wiring route name, the wiring priority, the route color and hatching, and the input layer received with the creating instruction from the apparatus administrator and the wiring route path, the route starting and the end points, the signal travel direction that are obtained from the automatically created wiring route (see FIG. 5). The wiring route creating section 14a registers the created wiring route information in the wiring route information storage section 13b and thus controls the same.

The wiring route output control section 14b is a processing section that displays and outputs a wiring route created by the wiring route creating section 14a. More specifically, the wiring route output control section 14b receives the output display instruction of a wiring route from the wiring route creating section 14a, and then superimposes a wiring route created by the wiring route creating section 14a on the printed circuit board data. Thus, the same is output and displayed from the output unit 12.

The apparatus administrator can study the wiring processing by using the wiring route that is output and displayed by the wiring route output control section 14b, and may use the wiring route without any additional processing in the wiring processing or may edit the wiring route manually to use the wiring route in the wiring processing. Alternatively, the apparatus administrator can utilize the wiring route as information reflecting an intention of the apparatus administrator for wiring processing, later when the apparatus administrator performs wiring processing.

When a cross point (intersecting point) is present between wiring routes as shown in FIG. 10, the wiring route output control section 14b highlights the cross point, for example, by using a read circle.

The wiring route output control section 14b displays wiring routes so that wiring routes with the same colors and hatchings are not arranged next to each other according to an input layer and signal type, for example, as shown in FIG. 11.

The wiring processing apparatus 10 can be implemented by providing the various functions described above on an information processing device such as a known personal computer or workstation.

Figure 12:
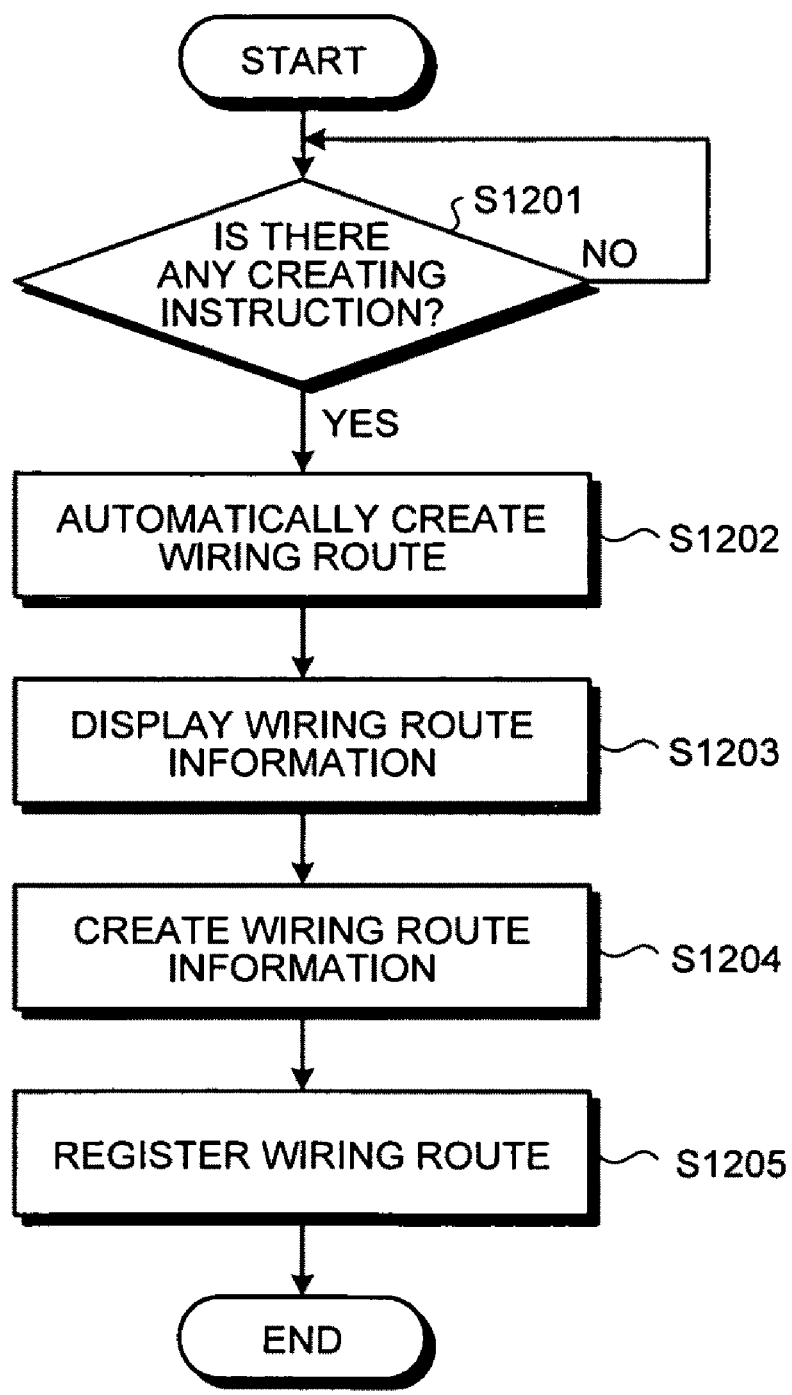
FIG. 12 is a flow diagram of processing flow performed by the wiring processing apparatus according to the first embodiment.

Referring to FIG. 12, processing performed by the wiring processing apparatus according to the first embodiment will be described. FIG. 12 is a flow diagram of processing flow performed by the wiring processing apparatus according to the first embodiment.

As shown in FIG. 12, the wiring route creating section 14a starts automatic creation of a wiring route (step S1202), upon receiving the creating instruction from the apparatus administrator via the input unit 11 (step S1201).

More specifically, the wiring route creating section 14a decides each group formed by sorting signals that flow between component pins, based on the settings performed by the apparatus administrator that is contained in the creating instruction (the settings of wiring groups and subgroups that belong to the wiring route and of a signal name).

Then, the wiring route creating section 14a reads the printed circuit board data from the printed circuit board data storage section 13a, and identifies a net cluster that belongs to each group, based on the net information of the printed circuit board data. After the net cluster that belongs to each group is identified, the wiring route creating section 14a refers one by one to the design specification wiring control information, the component information, and component pin information that are contained in the printed circuit board data, based on the affiliation pin information and the wiring control code contained in the net information that correspond to each of the identified net cluster, and automatically creates a wiring route that indicates a wiring scanning area of a signal cluster in each group. Then, the wiring route creating section 14a transmits an output display instruction to the wiring route output control section 14b that will be described below so that the wiring route thus created is displayed.

The wiring route output control section 14b receives the output display instruction of the wiring route from the wiring route creating section 14a, superimposes the wiring route created by the wiring route creating section 14a on the printed circuit board data, and displays and output the same from the output unit 12 (step S1203).

The wiring route creating section 14a also automatically creates wiring route information that corresponds to each wiring route (step S1204) after the wiring route is automatically created. More specifically, the wiring route creating section 14a creates wiring route information, by processing the wiring route name, the wiring priority, the route color and hatching, and the input layer that are received with the creating instruction from the apparatus administrator, and the wiring route path, the route starting and end points, and the signal travel direction that are obtained from the automatically created wiring route. Then, the wiring route creating section 14a registers the wiring route information thus created in the wiring route information storage section 13b and controls the same (step S1205).

As described above, in the first embodiment, each group formed by sorting signals that flow in the printed board is decided, and each wiring route that indicates a wiring scanning area of a signal cluster in each group is automatically created and displayed on the printed board data as well as wiring route information that corresponds to each wiring route thus displayed is automatically created and controlled. Thus, the first embodiment can provide more quickly, wiring strategy or useful information that is created by the designer in related art, by automatically creating in advance wiring route information to be utilized for automatic wiring of a printed board. Further, according to the first embodiment, when the wiring route information thus controlled is utilized for wiring processing, wiring of a critical printed board can be simplified as well as a design period of a printed board can be reduced.

According to the first embodiment, essential information for deciding a wiring route can be controlled and thus utilized effectively.

According to the first embodiment, a destination which each signal is connected to can be clearly displayed and provided.

According to the first embodiment, intersecting condition of wiring paths can be provided in real time.

According to the first embodiment, wiring paths can be distinctly sorted by layer and signal type, and thus displayed.

In the first embodiment, the wiring processing apparatus may be configured such that wiring route information that is automatically created is associated to automatic wiring processing, as well as a result of automatic wiring processing may be verified according to the wiring route information. Thus, in a second embodiment of the present invention below, a configuration of a wiring processing apparatus according to the second embodiment will be described.

Figure 13:
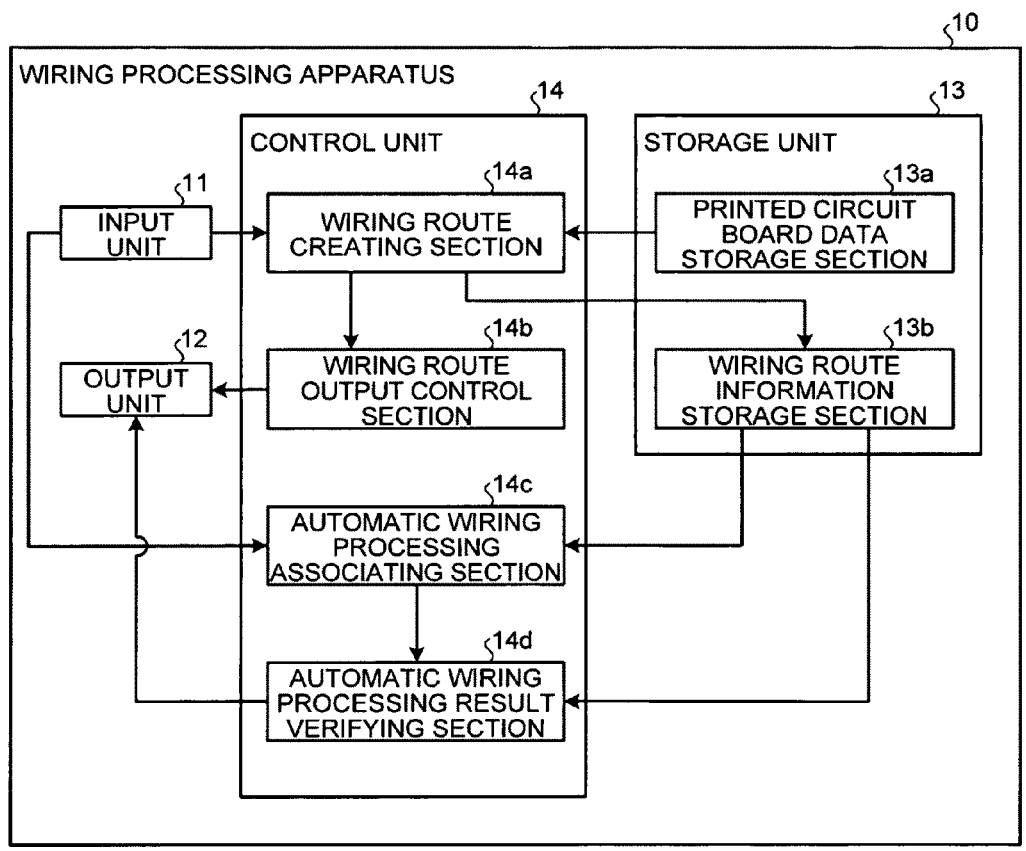
FIG. 13 is a block diagram of configuration of a wiring processing apparatus according to a second embodiment of the present invention.
Figure 14:
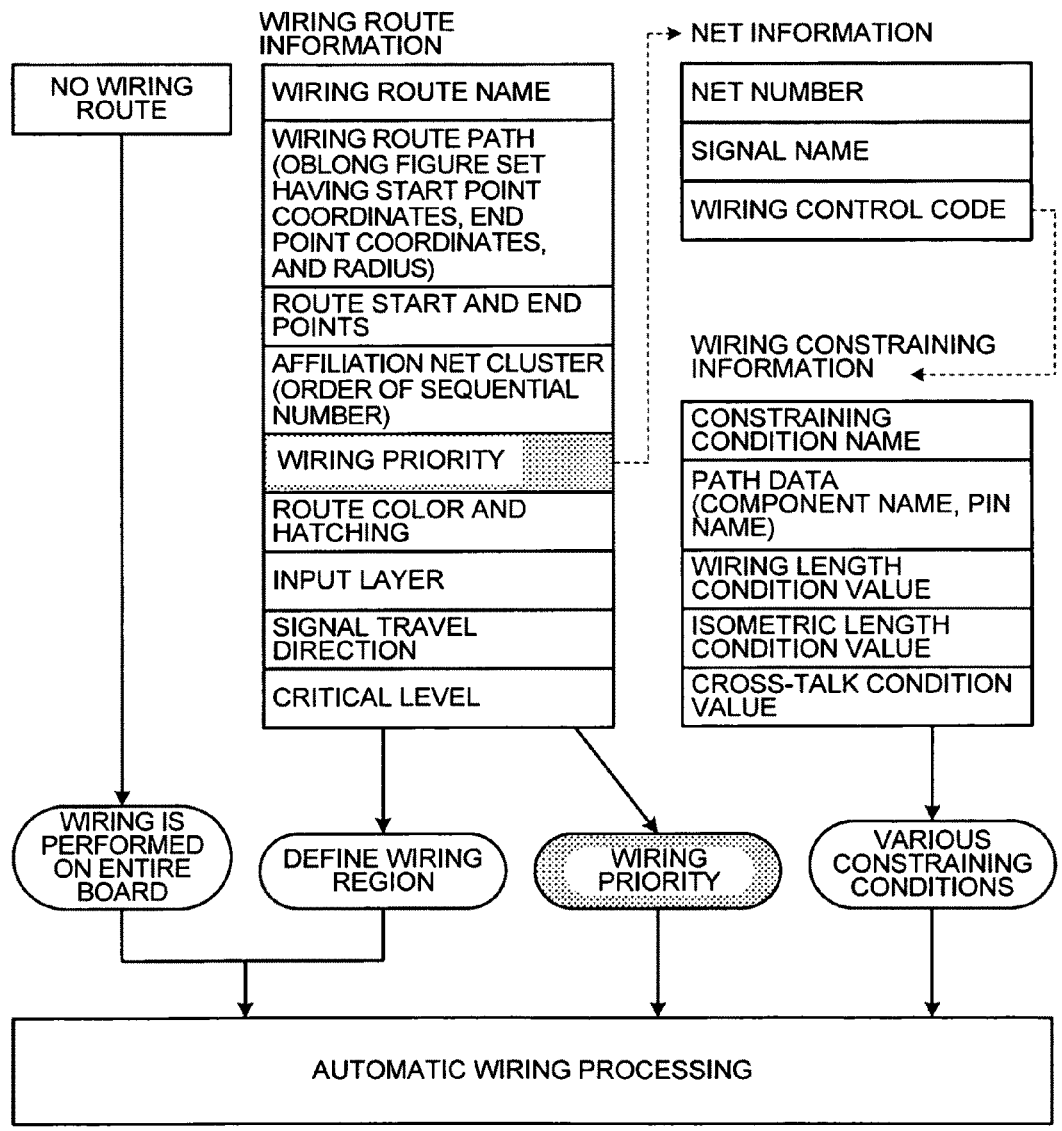
FIG. 14 is a diagram of an association between automatic wiring processing and wiring route information in the second embodiment.
Figure 15:
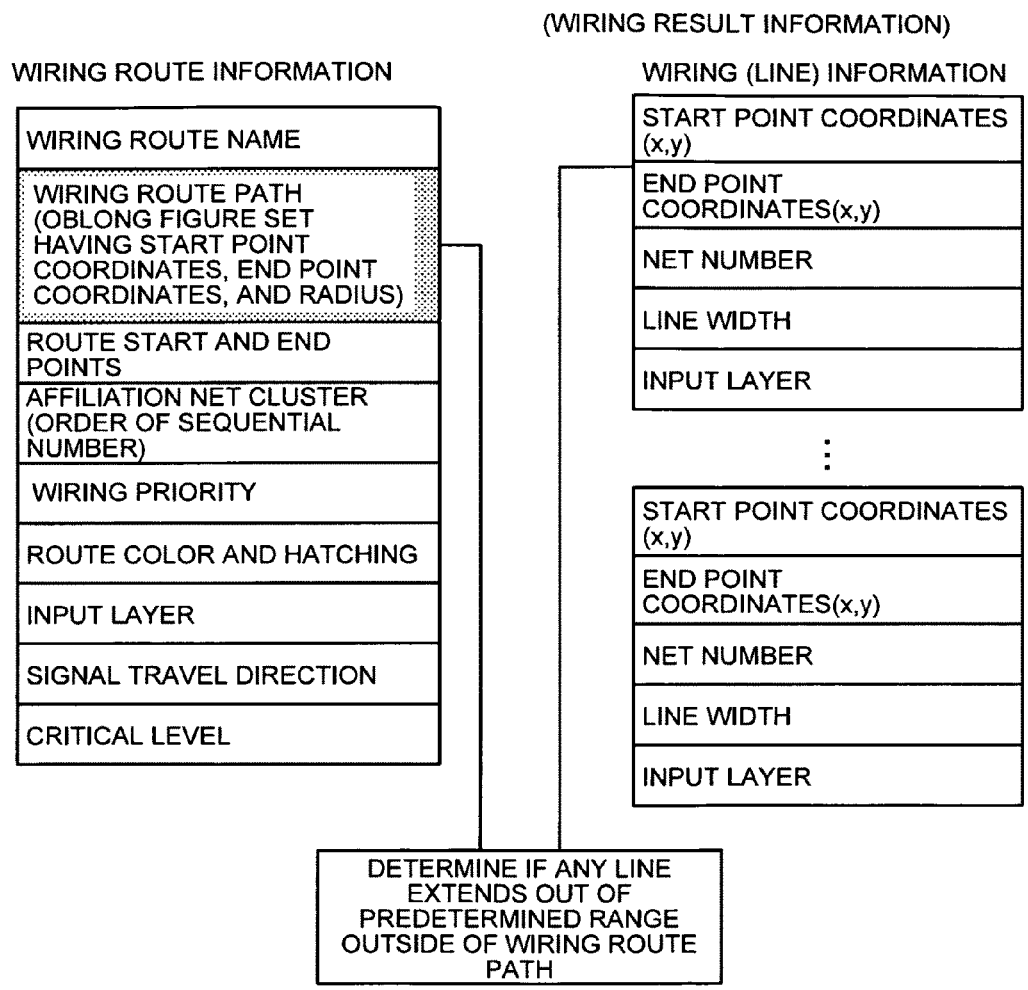
FIG. 15 is a diagram for explaining verification of a result of the automatic wiring processing according to the second embodiment.

Referring to FIGS. 13 to 15, the configuration of the wiring processing apparatus according to the second embodiment will be described below. FIG. 13 is a block diagram of the configuration of the wiring processing apparatus according to the second embodiment. FIG. 14 is a diagram of an association between automatic wiring processing and wiring route information in the second embodiment. FIG. 15 is a diagram for explaining verification of a result of the automatic wiring processing according to the second embodiment. Configuration of the wiring processing apparatus according to the second embodiment is basically similar to the configuration of the wiring processing apparatus according to the first embodiment. There is a difference, however, in an automatic wiring processing associating section 14c and an automatic wiring processing result verifying section 14d that will be described below.

The automatic wiring processing associating section 14c reads wiring route information, and associates the wiring route information to automatic wiring processing function that performs automatic wiring processing (not shown).

More specifically, for example, when an automatic wiring processing instruction that specifies wiring route name of a wiring route where automatic wiring processing is performed is received from an apparatus administrator via the input unit 11, wiring route information that corresponds to the specified wiring route name is read from the wiring route information storage section 13b. Then, the wiring route information is transmitted to automatic wiring processing function so that automatic wiring processing function is performed within a wiring region on the printed board data defined according to the wiring route path (see FIG. 14). The automatic wiring processing function performs automatic wiring processing within the defined wiring region.

When the automatic wiring processing instruction that specifies all the wiring route names is received from the apparatus administrator, the automatic wiring processing associating section 14c reads wiring route information that corresponds to all the wiring route names from the wiring route information storage section 13b. Then, the automatic wiring processing associating section 14c transmits each wiring route information to the automatic wiring processing function so that automatic wiring processing is performed within the wiring region on the printed board data defined according to the wiring route path in the order of wiring priority (see FIG. 14). The automatic wiring processing function performs automatic wiring processing within the defined wiring region in the order of the wiring priority.

The automatic wiring processing associating section 14c also reads wiring constraining information from the printed circuit board data storage section 13a, based on net information that corresponds to affiliation net cluster contained in the wiring route information. Then, the automatic wiring processing associating section 14c transmits the wiring constraining information to the automatic wiring processing function along with the wiring route information (see FIG. 14). The automatic wiring processing function performs automatic wiring processing while satisfying not only the wiring region and the wiring priority but various constraining conditions based on the wiring constraining information also.

When a wiring route name is not specified in the automatic wiring processing instruction received from the apparatus administrator, the automatic wiring processing associating section 14c performs automatic wiring processing on the entire printed circuit board.

The automatic wiring processing result verifying section 14d verifies a result of the automatic wiring processing performed by the automatic wiring processing function.

More specifically, after the automatic wiring processing is completed, the automatic wiring processing function registers wiring (line) information, which is wiring result information, in the printed circuit board data storage section 13a, and transmits a completion notice of the automatic wiring processing to the automatic wiring processing result verifying section 14d.

When the completion notice of the automatic wiring processing is received from the automatic wiring processing function, the automatic wiring processing result verifying section 14d reads wiring (line) information, which is wiring result information, from the printed circuit board data storage section 13a as well as wiring route information from the wiring route information storage section 13b. Then, the automatic wiring processing result verifying section 14d compares wiring information and wiring route information that correspond to each other, and determines if any line extends out of a predetermined range outside of the wiring route path (see FIG. 15).

The automatic wiring processing result verifying section 14d displays and outputs a result of verification from the output unit 12, and provides the same to the apparatus administrator.

According to the second embodiment, automatic wiring processing can be performed critically and efficiently, because in the second embodiment, as described above, wiring route information is associated to the automatic wiring processing function that performs wiring processing of a signal cluster that belongs to the wiring route.

According to the second embodiment, it can be examined if a result of the automatic wiring processing satisfies an intention of the designer, because in the second embodiment, it is determined if a result of the automatic wiring processing satisfies the wiring route information.

The present invention may be implemented in other various embodiments other than the embodiments described above.

Thus, a third embodiment will be described as another embodiment of the present invention.

(1) Modification of Wiring Route

Figure 16:
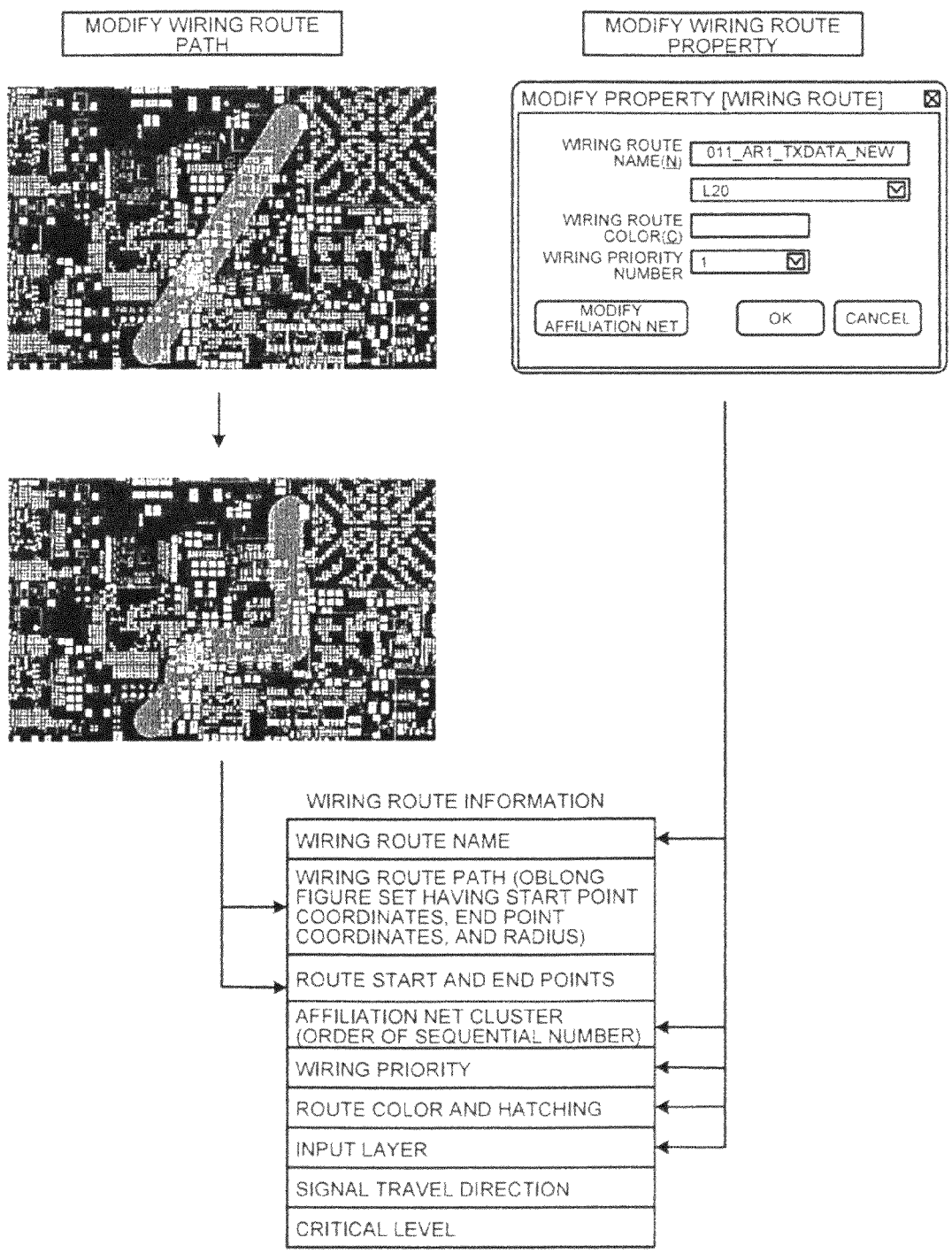
FIG. 16 is a diagram for explaining a modification of wiring route according to a third embodiment of the present invention.

In the embodiments above, for example, as shown in FIG. 16, the wiring route that is displayed and output may be modified manually by the apparatus administrator, and the wiring route information (wiring route path, and route starting and end points) may be updated accordingly with the modification. Thus, according to the third embodiment, a wiring route can be edited accordingly with an arranging condition of components and other obstacles.

As shown in FIG. 16, when the apparatus administrator modifies a property of a wiring route (wiring route name or wiring priority thereof), the wiring route information may be updated accordingly with the modification.

(2) Automatic Correction of Wiring Route

Figure 17:
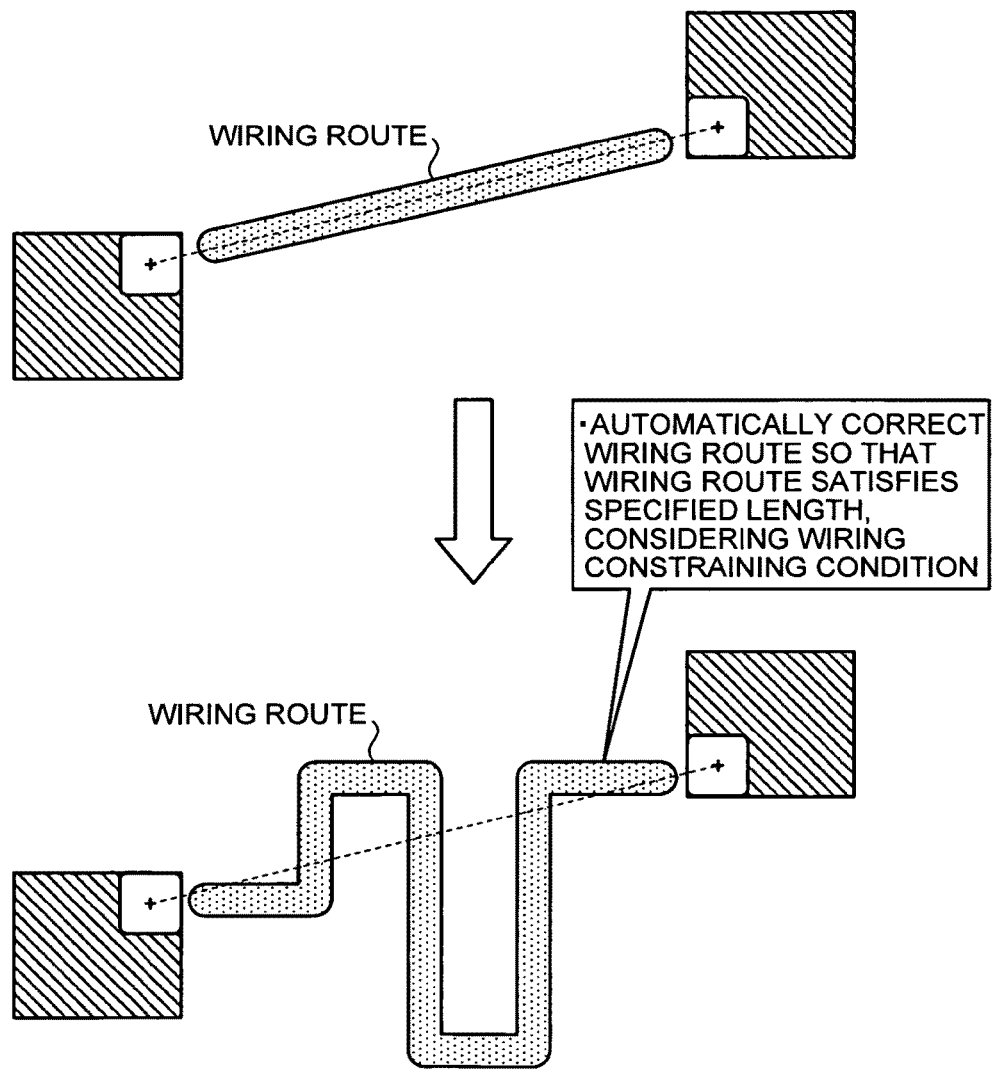
FIG. 17 is a diagram for explaining automatic correction of a wiring route according to the third embodiment.

In the embodiments above, for example, as shown in FIG. 17, a wiring route may be corrected automatically according to a wiring constraining condition of a net cluster that belongs to the wiring route. Thus, according to the third embodiment, a wiring route can be provided easily that is corrected automatically so that a constraining condition such as a specified wiring length is satisfied.

(3) Apparatus Configuration and the Like

The constituent elements of the wiring processing apparatus 10 shown in FIG. 2 or 13 are functionally conceptual and are not always physically configured as illustrated. Specifically, a specific pattern in which the wiring processing apparatus 10 are dispersed or integrated is not limited to the illustrated pattern. The wiring processing apparatus 10 may be configured by functionally or physically dispersing or integrating all or some of the devices on a given unit according to various loads or service conditions, for example, by integrating the wiring route creating section 14a and the wiring route output controlling section 14b, or by integrating the automatic wiring processing associating section 14c and the automatic wiring processing result verifying section 14d. Further, all or some of the processing functions performed by the wiring processing apparatus 10 (see, for example, FIGS. 2, 12, and 13) may be implemented by a central processing unit (CPU) or a program that is analyzed and executed by the CPU, or by wired-logic hardware.

(4) Wiring Path Information Creating Program

Figure 18:
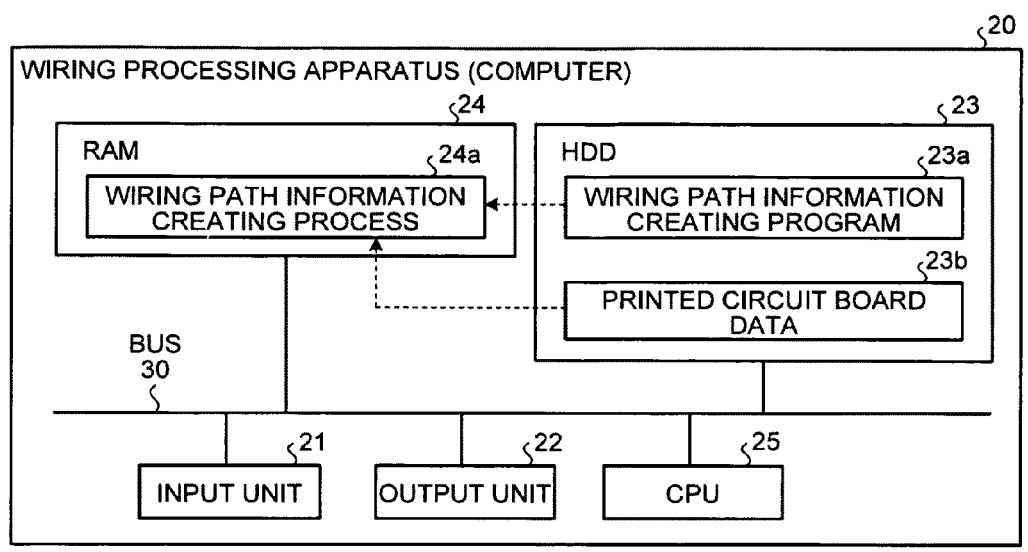
FIG. 18 is a diagram of a computer that executes a wiring path information creating program.

Various processing of the wiring processing apparatus 10 described in the embodiments (see, for example, FIGS. 2, 12, and 13) can be implemented by executing, on a computer system such as a personal computer or a workstation, a program prepared in advance. Thus, referring to FIG. 18, an example of a computer that executes a wiring path information creating program having functions similar to the embodiments will be described below. FIG. 18 is a diagram of a computer that executes a wiring path information creating program.

As shown in FIG. 18, a computer 20, as a wiring processing apparatus, is configured such that the computer 20 includes an input unit 21, an output unit 22, a hard disk drive (HDD) 23, a random access memory (RAM) 24, and a CPU 25 are connected to a bus 30.

The input unit 21 receives various data input from a user. The output unit 22 displays various information. The HDD 23 stores therein information necessary for executing various processing by the CPU 25. The RAM 24 stores therein various information temporarily. The CPU 25 performs various arithmetic processing.

As shown in FIG. 18, the HDD 23 stores therein in advance a wiring path information creating program 23a that performs functions similar to each processing unit of the wiring processing apparatus 10 shown in the embodiments and a printed circuit board data 23b. The wiring path information creating program 23a may be optionally distributed and stored in storage units of other computers communicatably connected via network.

When the CPU 25 reads the wiring path information creating program 23a from the HDD 23 and expands the same on the RAM 24, the wiring path information creating program 23a functions as the wiring path information creating process 24a, as shown in FIG. 18. The wiring path information creating process 24a reads information such as the printed circuit board data 23b from the HDD 23 and expands the same on a region on the RAM 24 assigned to the wiring path information creating process 24a. Thus, the wiring path information creating process 24a performs various processing according to data thus expanded. The wiring path information creating process 24a corresponds to processing performed in the control unit 14 (the wiring route creating section 14a, the wiring route output control section 14b, the automatic wiring processing associating section 14c, and the automatic wiring processing result verifying section 14d) of the wiring processing apparatus 10 shown in FIG. 2 or 13.

It is not always necessary that the wiring path information creating program 23a is stored in the HDD 23 in advance. Each program may be stored in a "portable physical media" such as a flexible disk (FD), a compact disk read only memory (CD-ROM), a digital versatile disk (DVD), a magnetic optical disk, an integrated circuit (IC) card that are inserted to the computer 20, or "other computers (or servers)" connected to the computer 20 via public lines, the Internet, a local area network (LAN), or a wide area network (WAN). Then, the computer 20 may be configured such that the computer 20 reads each program therefrom and executes the same.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A wiring path information creating method for creating wiring path information pertaining to wiring processing of a printed board with a computer, the method comprising:
    deciding each group of signals by sorting signals that flow on the printed board;
    automatically creating one or more wiring paths each indicating a wiring scanning area of signals in each group and being represented by an oblong figure having start point coordinates, end point coordinates, and a radius;
    displaying the wiring paths on printed board data;
    automatically creating wiring path information that corresponds to each of the wiring paths; and
    controlling the wiring path information created for each of the wiring paths.

2. The wiring path information creating method according to claim 1, wherein the controlling includes controlling, as the wiring path information, at least a definition of a path for scanning wiring, a definition of a layer of the printed board for scanning wiring, a definition of critical level of the signals that scan wiring, a definition of priority against other groups when wiring is scanned, a definition of the signals to be wired, a definition of conductor spacing between the signals to be wired, a definition of conductor width of the signals to be wired, a definition of alignment sequence of the signals to be wired, and a travel direction of the signals to be wired.

3. The wiring path information creating method according to claim 2, further comprising displaying a wiring rat's nest that indicates a destination to which the signals are connected, based on the alignment sequence of the signals to be wired that is controlled at the controlling.

4. The wiring path information creating method according to claim 2, further comprising associating the wiring path information controlled to an automatic wiring processing function that performs wiring processing of signals that belongs to each of the wiring paths.

5. The wiring path information creating method according to claim 4, further comprising verifying if a result of automatic wiring processing performed by the automatic wiring processing function satisfies the wiring path information controlled.

6. The wiring path information creating method according to claim 1, further comprising individually displaying the wiring paths on the printed board data by using at least one of (1) different colors and (2) hatching patterns according to a layer to which each of the wiring paths is assigned or a signal type thereof.

7. The wiring path information creating method according to claim 6, further comprising displaying a wiring rat's nest that indicates a destination to which the signals are connected, based on the alignment sequence of the signals to be wired that is controlled at the controlling.

8. The wiring path information creating method according to claim 1, further comprising highlighting an intersecting condition of the wiring paths displayed on the printed board data.

9. The wiring path information creating method according to claim 1, further comprising modifying at least one of the wiring paths displayed on the printed board data while maintaining connection of the signals.

10. The wiring path information creating method according to claim 1, further comprising automatically correcting the wiring paths so as to satisfy a wiring constraining condition of signals that belongs to each of the wiring paths displayed on the printed board data.

11. The wiring path information creating method according to claim 1, wherein
    the wiring path is created from the barycenter of a rectangle that includes component pins on the printed board.

12. The wiring path information creating method according to claim 1, wherein
    the wiring path has a vector, two vectors, or three vectors.

13. A computer program product having a computer readable medium including programmed instructions for creating wiring path information pertaining to wiring processing of a printed board, wherein the instructions, when executed by a computer, cause the computer to perform:
    deciding each group of signals by sorting signals that flow on the printed board;
    automatically creating one or more wiring paths each indicating a wiring scanning area of signals in each group and being represented by an oblong figure having start point coordinates, end point coordinates, and a radius;
    displaying the wiring paths on printed board data;
    automatically creating wiring path information that corresponds to each of the wiring paths; and
    controlling the wiring path information created for each of the wiring paths.

14. The computer program product according to claim 13, wherein the controlling includes controlling, as the wiring path information, at least a definition of a path for scanning wiring, a definition of a layer of the printed board for scanning wiring, a definition of critical level of the signals that scan wiring, a definition of priority against other groups when wiring is scanned, a definition of the signals to be wired, a definition of conductor spacing between the signals to be wired, a definition of conductor width of the signals to be wired, a definition of alignment sequence of the signals to be wired, and a travel direction of the signals to be wired.

15. The computer program product according to claim 14, wherein the instructions further cause the computer to perform displaying a wiring rat's nest that indicates a destination to which the signals are connected, based on the alignment sequence of the signals to be wired that is controlled at the controlling.

16. The computer program product according to claim 14, wherein the instructions further cause the computer to perform associating the wiring path information controlled to an automatic wiring processing function that performs wiring processing of signals that belongs to each of the wiring paths.

17. The computer program product according to claim 16, wherein the instructions further cause the computer to perform verifying if a result of automatic wiring processing performed by the automatic wiring processing function satisfies the wiring path information controlled.

18. The computer program product according to claim 13, wherein the instructions further cause the computer to perform individually displaying the wiring paths on the printed board data by using at least one of (1) different colors and (2) hatching patterns according to a layer to which each of the wiring paths is assigned or a signal type thereof.

19. The computer program product according to claim 13, wherein the instructions further cause the computer to perform highlighting an intersecting condition of the wiring paths displayed on the printed board data.

20. The computer program product according to claim 13, wherein the instructions further cause the computer to perform modifying at least one of the wiring paths displayed on the printed board data while maintaining connection of the signals.

21. The computer program product according to claim 13, wherein the instructions further cause the computer to perform automatically correcting the wiring paths so as to satisfy a wiring constraining condition of signals that belongs to each of the wiring paths displayed on the printed board data.

22. A wiring path information creating apparatus for creating wiring path information pertaining to wiring processing of a printed board with a computer, the apparatus comprising:
 a wiring path information creating unit that decides each group of signals by sorting signals that flow on the printed board, automatically creates one or more wiring paths each indicating a wiring scanning area of signals in each group and being represented by an oblong figure having start point coordinates, end point coordinates, and a radius, displays the wiring paths on printed board data, and automatically creates wiring path information that corresponds to each of the wiring paths; and
 a wiring path information control unit that controls the wiring path information created for each of the wiring paths.

* * * * *